United States Patent
Reuter et al.

(10) Patent No.: US 9,464,732 B2
(45) Date of Patent: Oct. 11, 2016

(54) APPARATUS FOR UNIFORM PUMPING WITHIN A SUBSTRATE PROCESS CHAMBER

(71) Applicant: APPLIED MATERIALS, INC., Santa Clara, CA (US)

(72) Inventors: Paul Benjamin Reuter, Austin, TX (US); Martin Jeffrey Salinas, San Jose, CA (US); Jared Ahmad Lee, Santa Clara, CA (US); Imad Yousif, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 709 days.

(21) Appl. No.: 13/871,671

(22) Filed: Apr. 26, 2013

(65) Prior Publication Data

US 2013/0284287 A1    Oct. 31, 2013

Related U.S. Application Data

(60) Provisional application No. 61/638,622, filed on Apr. 26, 2012.

(51) Int. Cl.
| | | |
|---|---|---|
| *C23C 16/00* | (2006.01) | |
| *F16L 3/00* | (2006.01) | |
| *H01L 21/67* | (2006.01) | |
| *H01L 21/687* | (2006.01) | |

(52) U.S. Cl.
CPC ........... *F16L 3/00* (2013.01); *H01L 21/67017* (2013.01); *H01L 21/6719* (2013.01); *H01L 21/68785* (2013.01); *Y10T 137/6966* (2015.04)

(58) Field of Classification Search
CPC .............. H01L 21/6719; H01L 21/68785; H01L 21/67017
See application file for complete search history.

(56) References Cited

U.S. PATENT DOCUMENTS

| | | | | |
|---|---|---|---|---|
| 2008/0018103 A1* | 1/2008 | Laib | ...................... | F16L 41/082 |
| | | | | 285/197 |
| 2008/0019810 A1* | 1/2008 | Rice | .................... | H01L 21/6773 |
| | | | | 414/222.05 |
| 2008/0190558 A1* | 8/2008 | Bailey | ............... | H01L 21/68785 |
| | | | | 156/345.26 |

FOREIGN PATENT DOCUMENTS

| | | | |
|---|---|---|---|
| WO | WO 2012/118606 A2 | 9/2012 | |
| WO | WO 2012/118897 A2 | 9/2012 | |
| WO | WO 2012118897 A2 * | 9/2012 | ........ H01J 37/32844 |
| WO | WO 2012/148568 A1 | 11/2012 | |

* cited by examiner

*Primary Examiner* — Gordon R Baldwin
*Assistant Examiner* — Charlee Bennett
(74) *Attorney, Agent, or Firm* — Moser Taboada; Alan Taboada (57) ABSTRACT

Substrate supports for use in process chambers having limited physical space for configuring chamber components are disclosed. In some embodiments, a substrate support may include a body having a support surface; a utilities feed coupled to the body and comprising a second portion coupled to and extending laterally away from the body beyond a diameter of the body, and first portion coupled to the second portion and extending perpendicularly away from the body; and a cover plate movably disposable beneath and with respect to the body between a first position disposed completely beneath the body, and a second position wherein the cover plate is disposed over the first portion of the utilities feed and includes a first portion disposed beneath the body, and wherein the first portion has a curved edge having a radius equal to the distance from a central axis of the support surface to the curved edge.

20 Claims, 10 Drawing Sheets

APPARATUS FOR UNIFORM PUMPING WITHIN A SUBSTRATE PROCESS CHAMBER

CROSS-REFERENCE TO RELATED APPLICATIONS

This application claims benefit of U.S. provisional patent application Ser. No. 61/638,622, filed Apr. 26, 2012, which is herein incorporated by reference in its entirety.

FIELD

Embodiments of the present invention generally relate to semiconductor manufacturing.

BACKGROUND

Various semiconductor manufacturing processes utilize cluster tools having multiple load lock chambers. In some embodiments, the multiple load lock chambers are stacked vertically. However, such a configuration presents a limited physical space for providing access to the chambers for certain facilities, particularly for the upper chamber of the stacked chambers. For example, the inventors have observed that uniform pumping around a substrate disposed within the upper load lock chamber may be negatively impacted by the configuration of the pump port and other physical components within the chamber due to the lack of vertical space to configure the process chamber.

Accordingly, the inventors have provided an improved apparatus for uniformly pumping within stacked process chambers or in other chambers where limited physical space may be an issue.

SUMMARY

Embodiments of substrate supports for use in process chambers having limited physical space for configuring chamber components are disclosed herein. In some embodiments, a chamber for handling a substrate may include a first chamber body having an inner volume defined in part by a floor, a ceiling, and one or more sidewalls; a ledge extending radially inward from the one or more sidewalls to define a central opening having a first diameter, wherein the ledge separates the inner volume into a processing volume disposed on one side of the ledge adjacent to the ceiling and a pumping volume disposed on an opposing side of the ledge adjacent to the floor; a pump port disposed through the floor of the first chamber body; a first opening disposed through the floor of the first chamber body; a substrate support disposed in the processing volume coaxially with respect to the central opening, the substrate support having a second diameter that is larger than the first diameter, where the substrate support is disposed in a spaced apart relation with respect to the ledge such that a gap is defined between a lower surface of the substrate support and the ledge; a utilities feed for providing utilities to the substrate support, wherein the utilities feed comprises a first portion disposed through the first opening and a second portion that extends laterally beneath the substrate support from the first opening to a location on a lower surface of the substrate support where the utilities feed is coupled to the substrate support; a notch disposed through the ledge from the central opening toward a sidewall of the one or more sidewalls, wherein at least a portion of the notch is aligned with the first opening and sized to facilitate passing the first portion of the utilities feed into the first opening; and a cover plate having a first edge that conforms to the geometry of the notch and a second edge with a radius equal to that of the central opening, wherein the cover plate is movably disposed between a first position that fills the notch and aligns the curved edge with the central opening such that the central opening and the curved edge together form a circle, and a second position that exposes the notch such that the first portion of the utilities feed can pass through the notch and into the first opening during installation.

In some embodiments, a substrate support is provided for use in a chamber for handling a substrate that comprises a first chamber body having an inner volume defined in part by a floor, a ceiling, and one or more sidewalls, a ledge extending radially inward from the one or more sidewalls to define a central opening having a first diameter, wherein the ledge separates the inner volume into a processing volume disposed on one side of the ledge adjacent to the ceiling and a pumping volume disposed on an opposing side of the ledge adjacent to the floor, a pump port and a first opening disposed through the floor of the first chamber body, and a notch disposed through the ledge from the central opening toward a sidewall of the one or more sidewalls, wherein at least a portion of the notch is aligned with the first opening and sized to facilitate passing a portion of the substrate support therethrough. In some embodiments, the substrate support may include a substrate support sized to be disposed in the processing volume coaxially with respect to the central opening, the substrate support having a second diameter that is larger than the first diameter, where the substrate support, when installed in the chamber, is disposed in a spaced apart relation with respect to the ledge such that a gap is defined between a lower surface of the substrate support and the ledge; a utilities feed for providing utilities to the substrate support, wherein the utilities feed comprises a first portion disposed through the first opening and a second portion that extends laterally beneath the substrate support from the first opening to a location on a lower surface of the substrate support where the utilities feed is coupled to the substrate support; and a cover plate having a first edge that conforms to the geometry of the notch and a second edge with a radius equal to that of the central opening, wherein the cover plate is movably disposed between a first position that fills the notch and aligns the curved edge with the central opening such that the central opening and the curved edge together form a circle, and a second position that exposes the notch such that the first portion of the utilities feed can pass through the notch and into the first opening during installation.

In some embodiments, a substrate support may include a body having a support surface to support a substrate; a utilities feed coupled to the body to provide utilities to the body, wherein the utilities feed comprises a second portion coupled to the body and extending laterally away from the body beyond a diameter of the body, and first portion coupled to the second portion and extending perpendicularly away from the body; and a cover plate movably disposable beneath and with respect to the body between a first position and a second position, wherein in the first position the cover plate is disposed predominantly beneath the body and not over the first portion of the utilities feed, wherein in the second position the cover plate is disposed over the first portion of the utilities feed and includes a portion disposed beneath the body, and wherein the portion disposed beneath the body has curved edge aligned with a radial arc of the body having a radius equal to the distance from a central axis of the support surface to the curved edge.

Other and further embodiments are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Embodiments of the present invention provide an improved apparatus for uniformly pumping around a substrate within a substrate processing chamber. Embodiments of the present invention may be utilized, in a non-limiting example, in a load lock chamber with limited vertical space, such as a stacked load lock chamber. Embodiments of the present invention may advantageously be used in any load lock or other substrate processing chamber where vertical space is limited. For example, the present invention may be used in combination with the dual load lock chamber described in PCT Patent Application Publication WO2012118897, published Sep. 7, 2012, entitled "Abatement and Strip Process Chamber in a Dual Loadlock Configuration". Alternatively, the present invention may be used in combination with the load lock chamber described in PCT Patent Application Publication WO 2012/148568, published Nov. 1, 2012, entitled "Method and Apparatus for Substrate Transfer and Radical Confinement".

Figure 1:
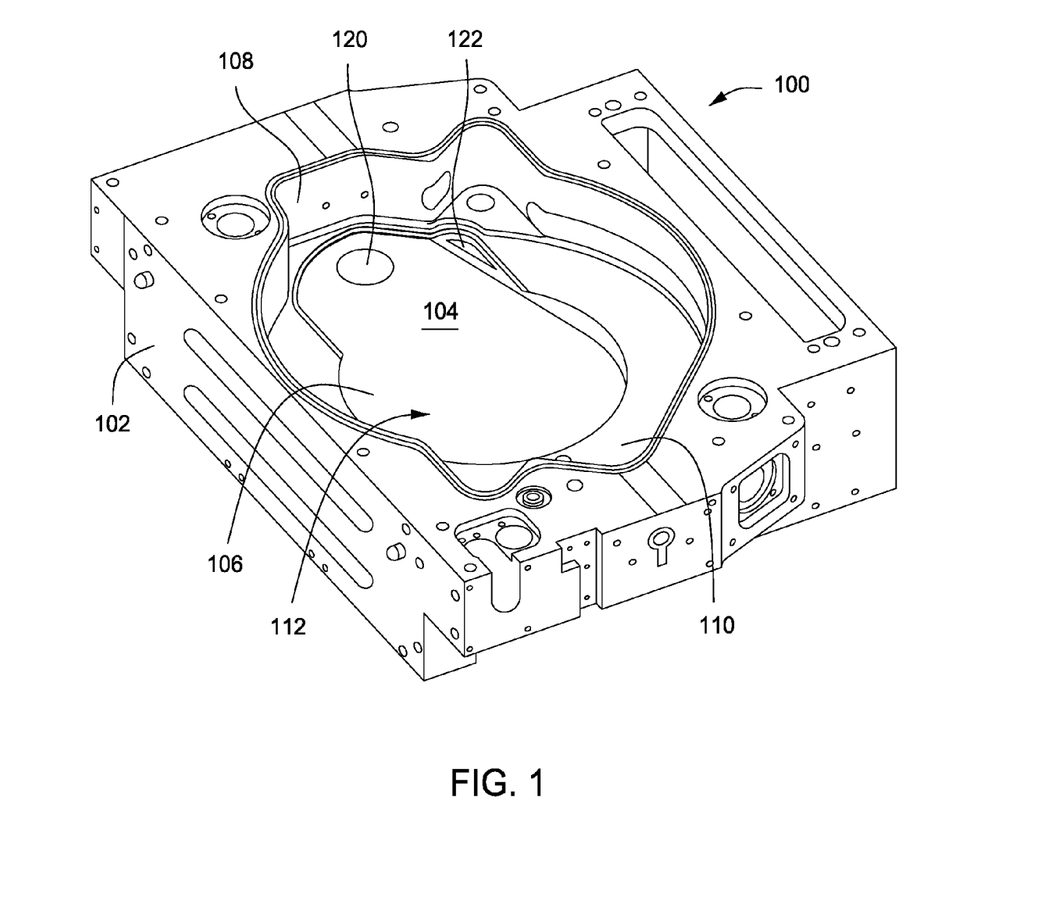
FIG. 1 depicts a perspective view of a chamber body in accordance with some embodiments of the present invention.
Figure 2:
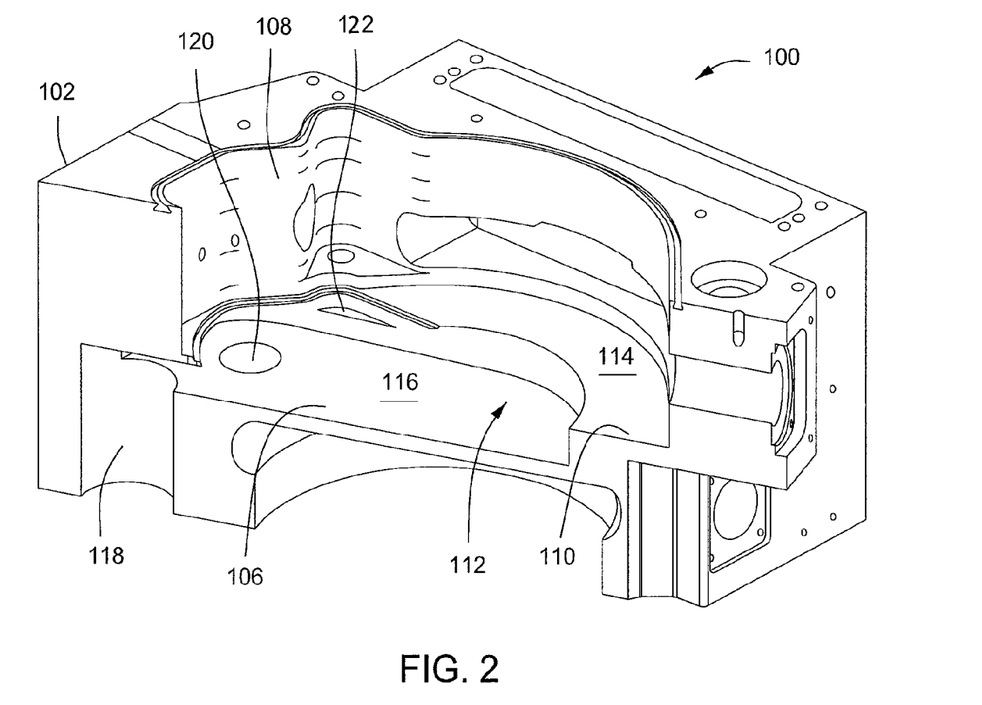
FIG. 2 depicts a sectional view through a pumping port of a chamber body in accordance with some embodiments of the present invention.
Figure 3:
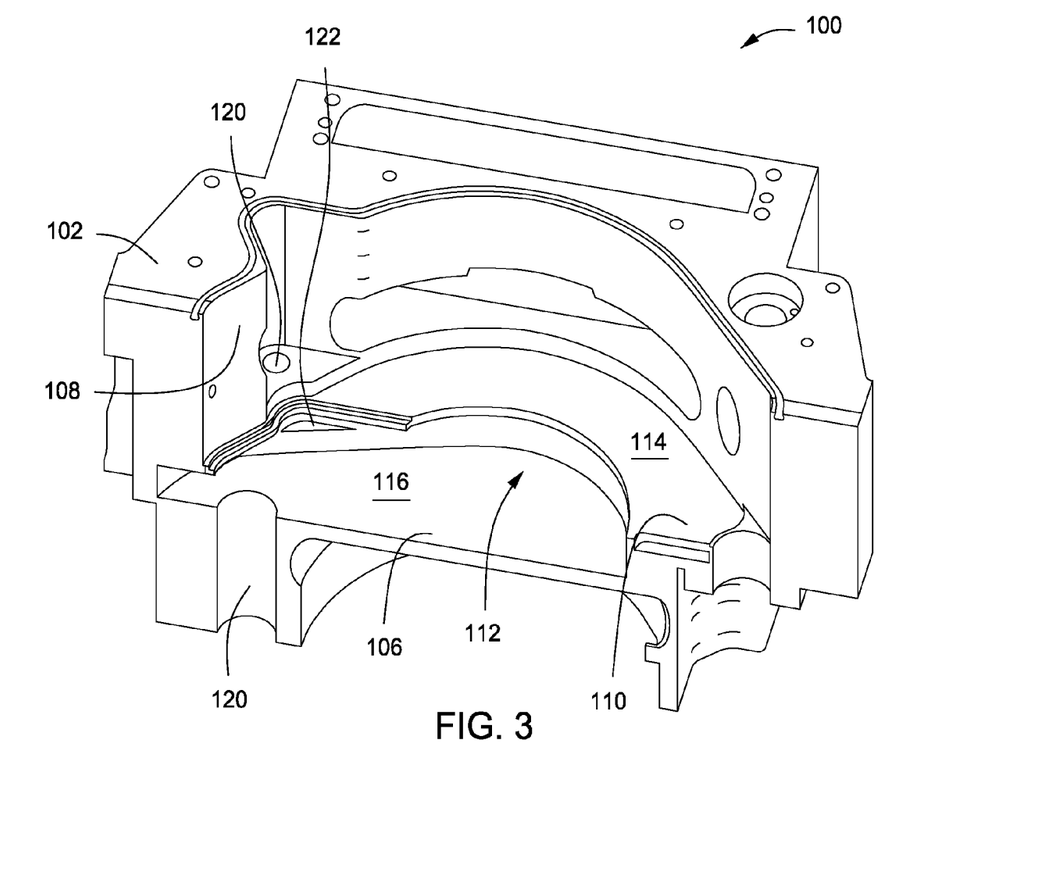
FIG. 3 depicts a sectional view through a first opening of a chamber body in accordance with some embodiments of the present invention.

FIG. 1 is a perspective view of a load lock chamber 100 in accordance with some embodiments of the present invention. FIG. 2 and FIG. 3 depict a sectional view of the load lock chamber body 100 in accordance with some embodiments of the present invention. The load lock chamber 100 includes a first chamber body 102. The first chamber body 102 has an inner volume 104 that is defined by a floor 106 and one or more sidewalls 108. In some embodiments, the load lock chamber 100 includes a first chamber body 102 disposed above a second chamber body as described in PCT Patent Application Publication WO2012118897. In some embodiments, the first chamber body 102 and the second chamber body are coupled together by bolts, welding or brazing. In some embodiments, the first chamber body 102 and the second chamber body are integrally formed, such as being formed from a single billet of material.

The first chamber body 102 has a ledge 110 that extends radially inward from the one or more sidewalls 108. The ledge 110 separates the inner volume 104 into a processing volume 114 on one side of the ledge 110, and a pumping volume 116 on an opposing side of the ledge 110. The first chamber body 102 also comprises a pump port 118 and a first opening 120. The pump port 118 and the first opening 120 are both disposed through the floor 106 of the first chamber body 102, proximate a side of the pumping volume 116. The pump port 118 and the first opening 120 are fluidly coupled to the inner volume 104 of the first chamber body 102. A central opening 112 is predominantly defined by the inner diameter of the ledge 110. A notch 122 is disposed through the ledge 110 and extends the central opening 112 toward a sidewall 108. At least a portion of the notch 122 is vertically aligned with the first opening 120 to permit access to the first opening 120 from the processing volume 114 side of the ledge 110.

Figure 4:
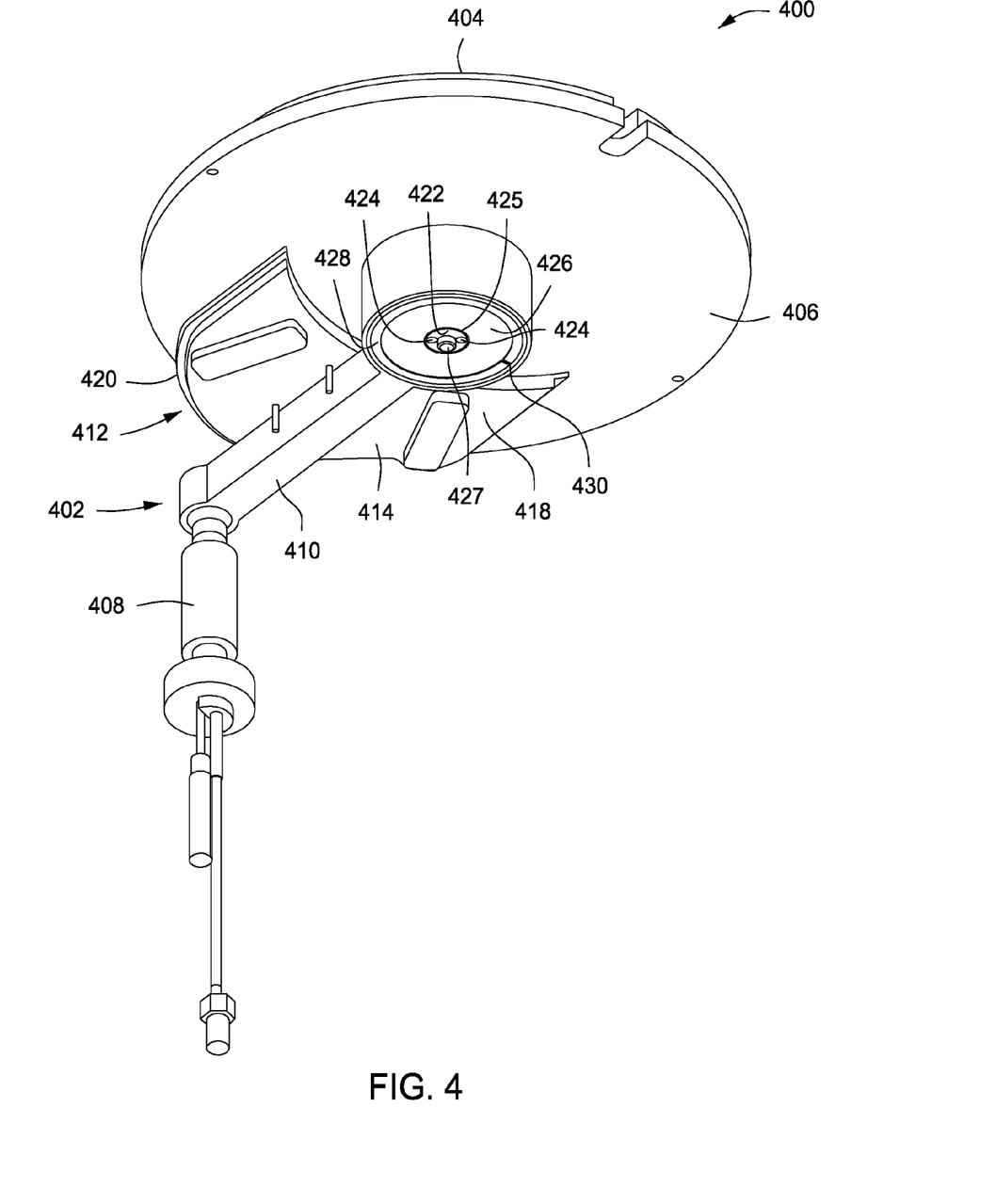
FIG. 4 depicts a perspective view of a substrate support, utilities feed, and cover plate assembled together in accordance with some embodiments of the present invention.
Figure 5:
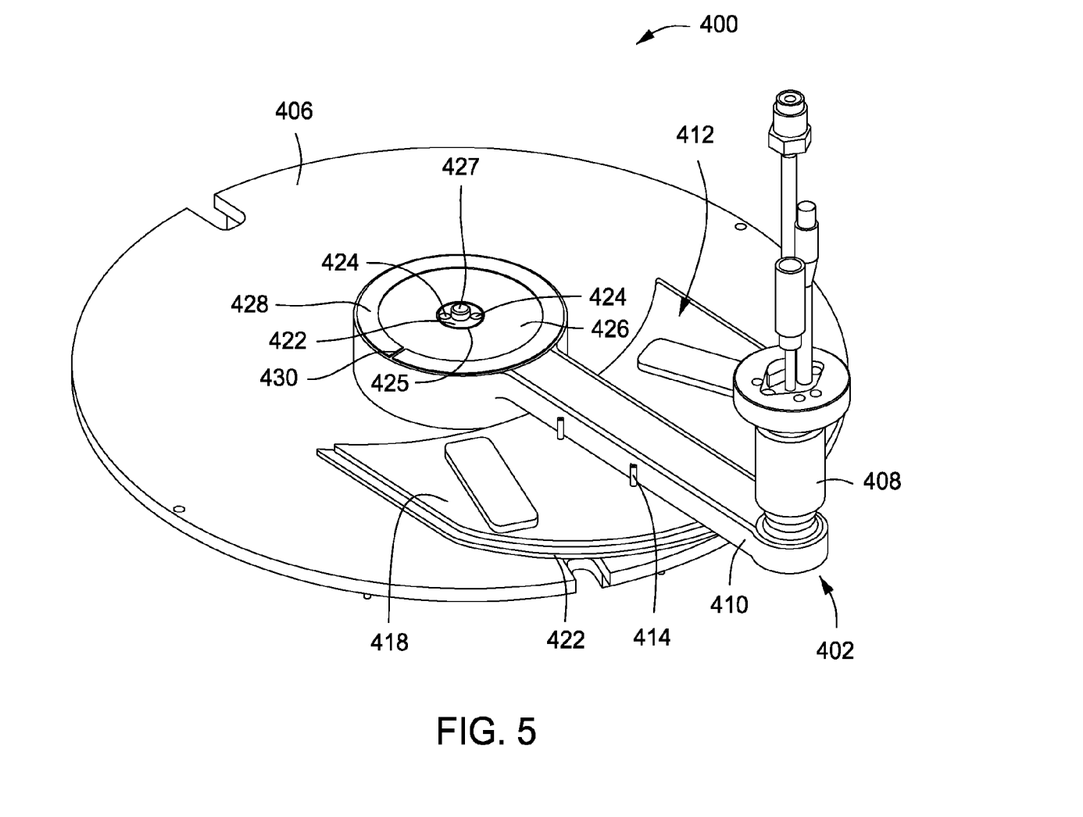
FIG. 5 depicts a perspective view of a substrate support, utilities feed, and cover plate assembled together in accordance with some embodiments of the present invention.

A substrate support may be disposed within the first chamber body 102 to support a substrate during processing. FIGS. 4 and 5 depict a perspective view of a substrate support 400, a utilities feed 402, and a cover plate 412 assembled together in accordance with some embodiments of the present invention suitable for use in the first chamber body 102. In some embodiments, the substrate support 400 includes a body which may comprise an upper plate 404 having an upper surface and a lower surface. The upper plate 404 is configured to support a substrate. In some embodiments, a lower plate 406 may be attached to the lower surface of the upper plate 404. A heating element may optionally be disposed between the upper plate 404 and the lower plate 406. In some embodiments, the heating element may be disposed in channels formed on an upper surface of the lower plate 406, a lower surface of the upper plate 404, or combinations thereof. The heating element may be a resistive heater or conduits arranged to flow a heat transfer fluid, or the like. In some embodiments, the lower plate 406 has an outer diameter that is larger than the outer diameter of the upper plate 404. The upper plate 404 and the lower plate 406 may be joined together in any suitable fashion, such as by bolts, clamps, welding, brazing, or the like. In some embodiments, the upper plate 404 and the lower plate 406 may be formed from metal, such as aluminum.

A utilities feed 402 is coupled to the substrate support 400 for providing utilities to the substrate support 400. The utilities feed 402 has a first portion 408 that may be disposed through the first opening 120 when installed and a second portion 410 that extends laterally underneath the substrate support 400 from the first opening 120 to a first location on the lower plate 406 of the substrate support 400 where the utilities feed 402 is coupled to the substrate support 400. In some embodiments, the first location may be coincident with a central axis of the support surface of the substrate support. In some embodiments, the first portion 408 of the utilities feed 402 comprises an extension tube. In some embodiments, the second portion 410 of the utilities feed 402 comprises a cantilevered tube. The cantilevered tube extends from a backside near the center of the lower plate 406 radially outward to connect with the extension tube disposed through the first opening 120 of the first chamber body 102.

The cantilevered tube and the extension tube provide a passageway for power supplies, sensors and other wiring to be used by the substrate support 400. In some embodiments, a heater power source, a sensor signal receiver and a chucking control unit are wired to the substrate support 400 through the passageway in the cantilevered tube and the extension tube. Other substrate support configurations may utilize partially or completely different utilities.

A more detailed description of the substrate support 400 can be found in PCT Patent Application Publication WO2012118606, published Sep. 7, 2012, entitled "Thin Heated Substrate support".

Figure 6A:
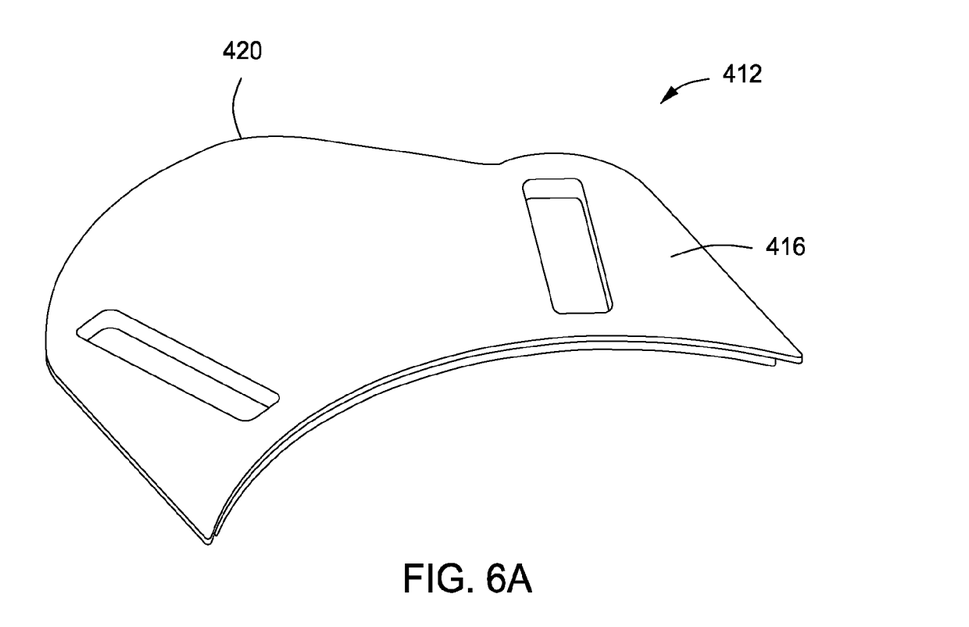
FIG. 6A depicts a perspective view of a first surface of the cover plate in accordance with some embodiments of the present invention.
Figure 6B:
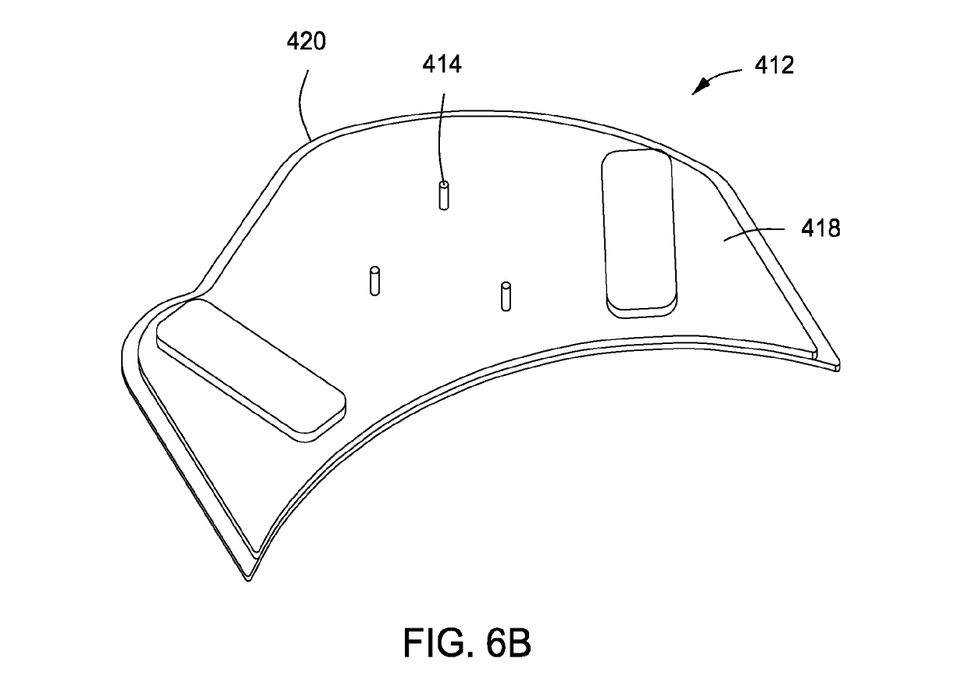
FIG. 6B depicts a perspective view of a second surface of the cover plate in accordance with some embodiments of the present invention.

FIGS. 6A and 6B depict a cover plate 412 having a first primary surface 416 and an opposing second primary surface 418. The cover plate 412 has substantially the same geometry as the notch 122. For example, the cover plate 412 has a first edge 420 that corresponds to the shape of the notch 122 and a second edge having a radius substantially equal to the radius of the central opening 112. The cover plate may be configured to interface with the substrate support 400 and be radially movably disposed with respect to the substrate support 400. For example, in some embodiments, the cover plate 412 may have a plurality of features, such as a plurality of pins 414, extending from the second surface 418 to interface with the second portion 410 of the utilities feed 402 to allow radial movement while preventing the cover plate 412 from sliding off of the second portion 410 of the utilities feed 402.

Returning to FIG. 4 and FIG. 5, the cover plate 412 may be movably disposed between the second portion 410 of the utilities feed 402 and the lower plate 406. The cover plate 412 can slide along the length of the second portion 410 of the utilities feed 402 between a first position to facilitate processing and a second position to facilitate installation and removal of the substrate support 400.

Figure 8:
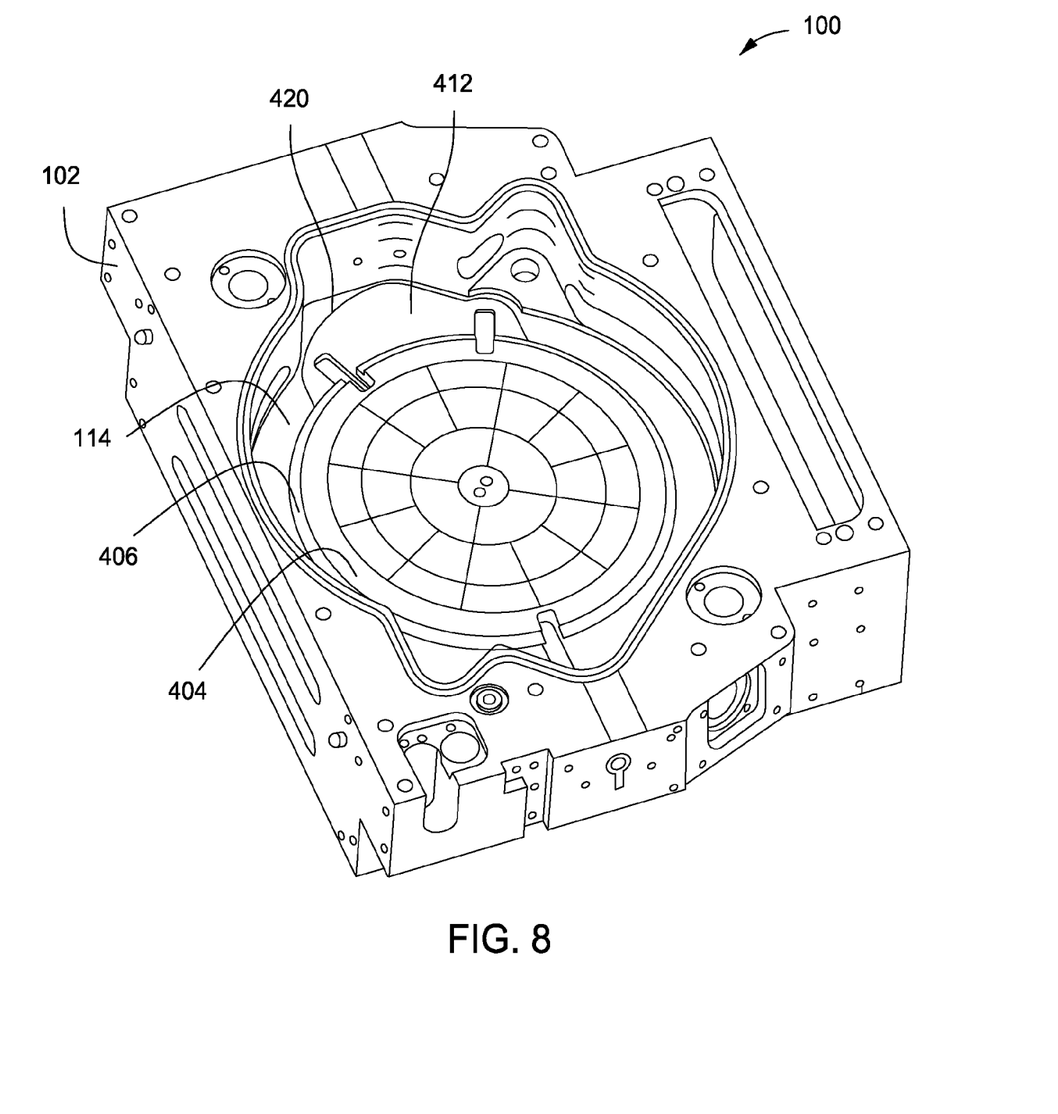
FIG. 8 depicts a perspective view of a substrate support and cover plate disposed within a chamber body in accordance with some embodiments of the present invention.
Figure 9:
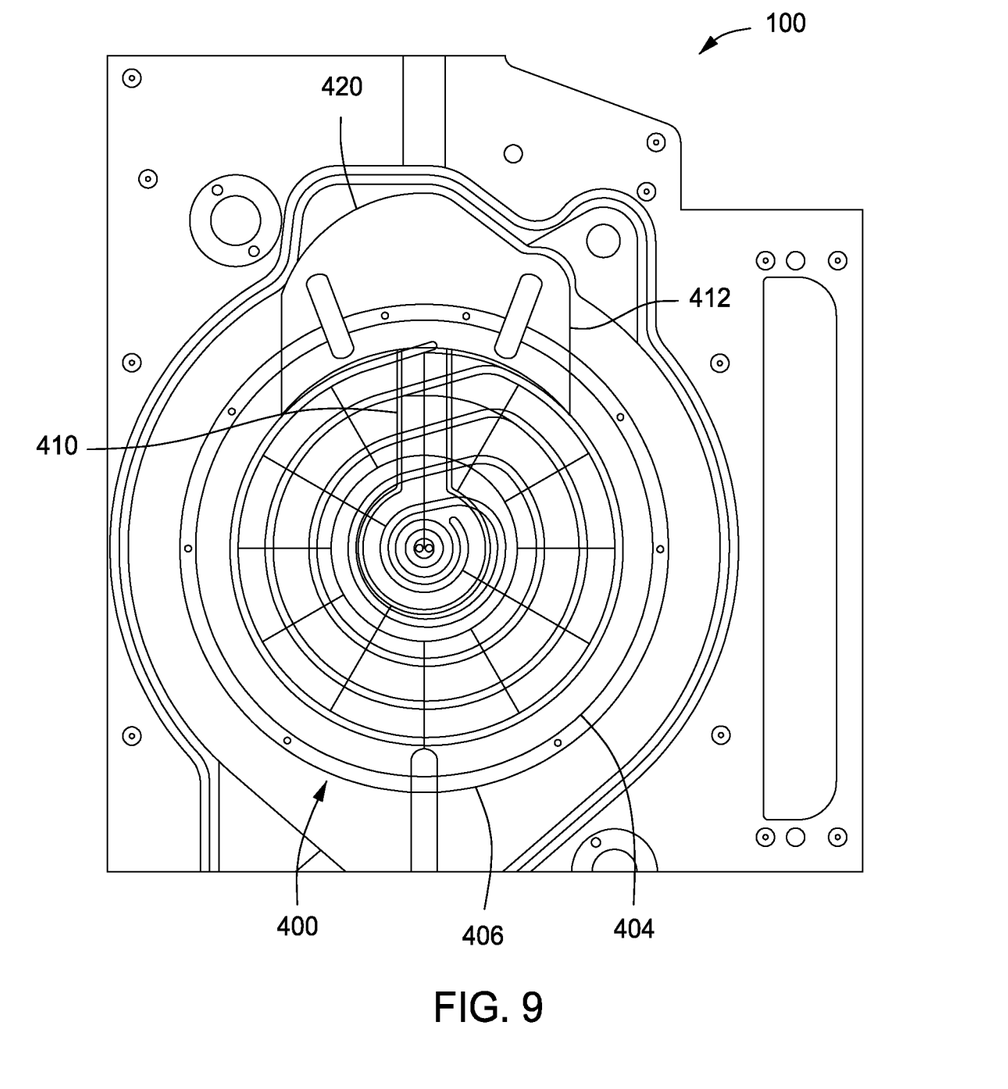
FIG. 9 depicts a top view of a cover plate in a first position in accordance with some embodiments of the present invention.
Figure 10:
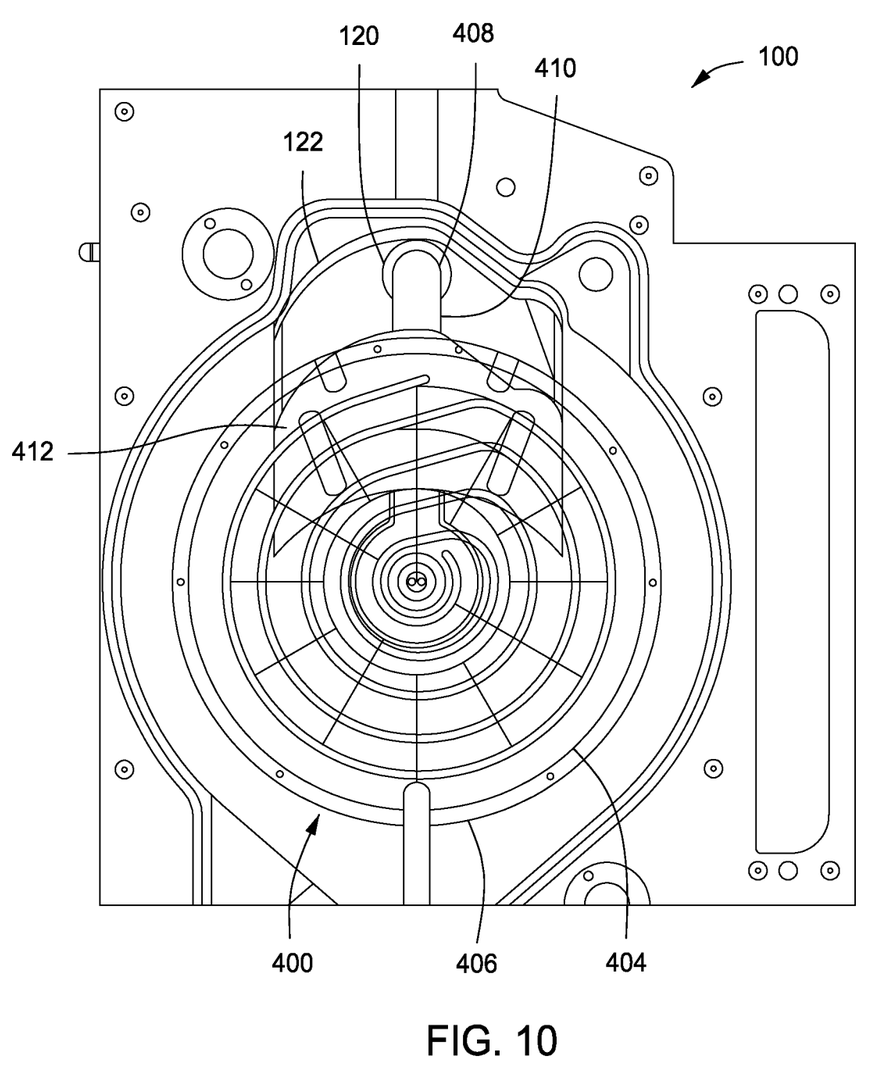
FIG. 10 depicts a top view of a cover plate in a second position in accordance with some embodiments of the present invention.

In some embodiments, as depicted in FIGS. 7 through 10, the substrate support 400 is disposed in the processing volume 114, coaxially with respect to the central opening 112 to define a substantially uniform gap between a lower surface of the substrate support 400 adjacent to the ledge 110 and an upper surface of the ledge 110. During installation of the substrate support 400 into the processing volume 114, the cover plate may be placed in the second position, as depicted in FIG. 10. Sliding the cover plate 412 to the second position exposes the notch 122 and allows the first portion 408 of the utilities feed 402 to pass through the notch 122 and into the first opening 120. At least a portion of the notch 122 is aligned with the first opening 120 to facilitate passing the first portion 408 of the utilities feed 402 into the first opening 120. Having the notch 122 exposed facilitates a line of sight view into the first opening 120 which advantageously facilitates proper alignment of the first portion 408 of the utilities feed, and therefore, of the substrate support 400 when installing the substrate support in the process chamber.

Once the substrate support 400 is installed, the cover plate 412 may be moved into the first position, as depicted in FIGS. 8 and 9, which fills the notch 122 and aligns the second edge of the notch 122 with the central opening 112. In this position, the central opening 112 and the curved edge 420 form a complete circle and provide a substantially uniform gap in both width and length around the entire periphery of the substrate support 400 between the upper surfaces of the ledge 110 and the curved edge 420 of the cover plate 412 and the lower surface of the body of the substrate support 400.

Figure 7:
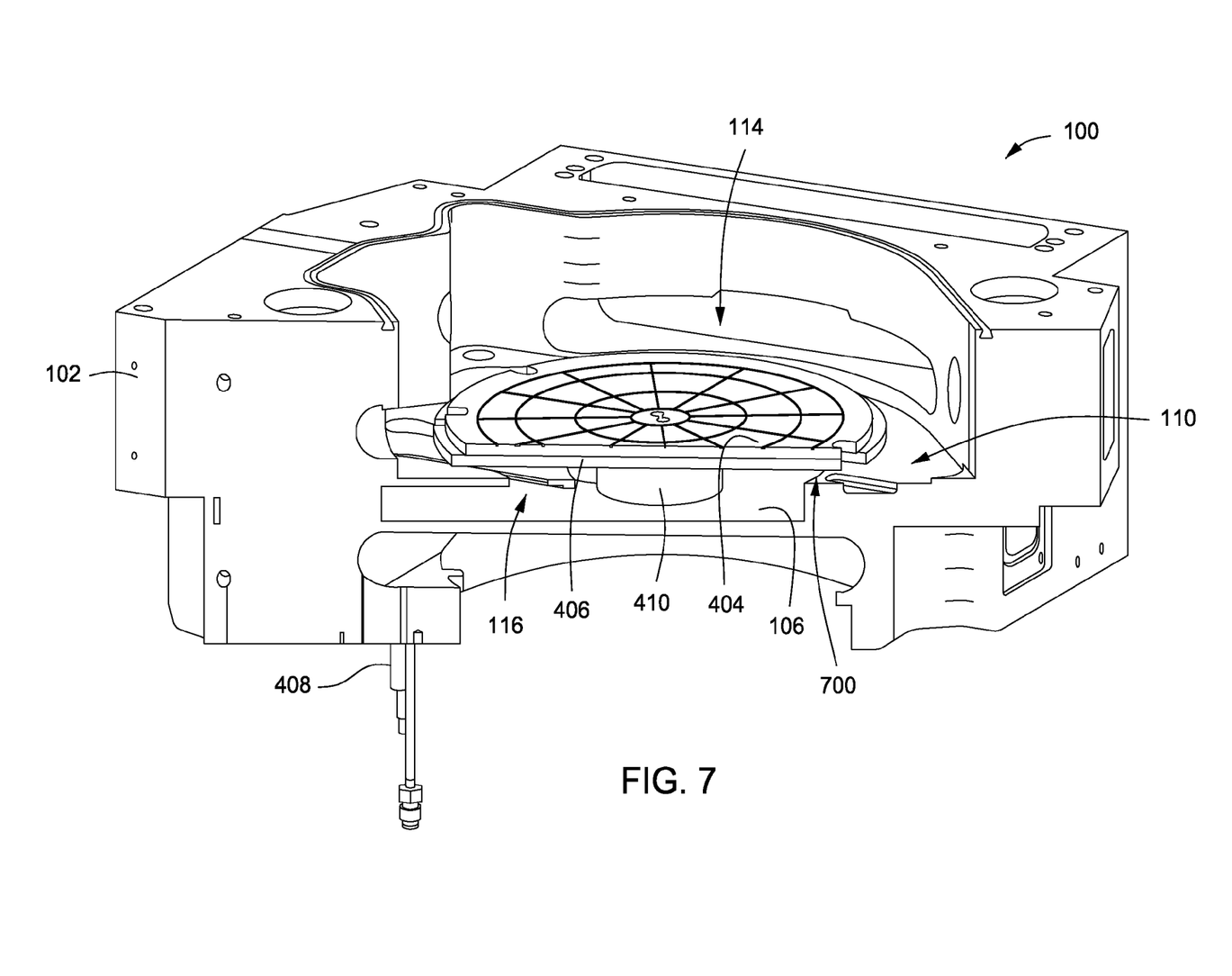
FIG. 7 depicts a perspective schematic view of a substrate support, and utilities feed assembled disposed within a chamber body in accordance with some embodiments of the present invention.

Accordingly, in some embodiments and as best depicted in FIG. 7, a portion of the substrate support 400 is disposed above and in a spaced apart relation with respect to the ledge 110, thereby creating a substantially uniform gap 700 between the lower plate 406 of the substrate support 400 and the ledge 110. The uniform gap 700 allows for substantially uniform gas flow from the processing volume 114 above the substrate support 400 to the pumping volume 116 and pumping port 118 below the substrate support 400. In some embodiments, a peripheral edge of the lower plate 406 overlaps the ledge 110 creating a restricted flow condition and enhancing uniform gas flow from the processing volume 114. The restricted flow condition may be, but need not be, a choked flow condition. However, the restricted flow condition should be sufficient to facilitate providing a more uniform pressure around the perimeter of the substrate support 400. In some embodiments, the gap 700 may illustratively be about 0.26 inches, although other dimensions, both smaller and larger, may be used.

In some embodiments as illustrated in FIGS. 4 and 5, one or more support structures, for example first support 422 and second support 426, may be disposed on the lower surface of the substrate support 400 near a central axis of the substrate support 400. When present, the first support 422 extends through an opening in the second portion 410 of the utilities feed 402. The first support 422 comprises a surface 425 configured to rest on the floor 106 of the first chamber body 102 to stabilize and provide vertical support to the substrate support 400 when installed. In some embodiments, the support structure comprises a locating structure, such as the boss 427, configured to locate the substrate support 400 within the volume 104. The boss 427 may be received in a cooperating feature, such as a suitably positioned and formed cavity (not shown) in the chamber floor 106.

In some embodiments, the first support 422 may comprise one or more holes 424 (two shown) formed through the support and sized to accept a fastener (not shown), such as a threaded fastener, to couple the substrate support 400 to the chamber floor 106.

The second support 426 may be disposed about the first support 422 and have a support surface, such as the raised lip 428 near the periphery. The raised lip 428 may be coplanar with the surface 425 and configured to rest on the floor 106 of the first chamber body 102 to stabilize and provide vertical support to the substrate support 400. The second support 426 may include additional support surfaces. The raised lip 428 may include a vent 430 to facilitate equalization of pressure between the volume 104 and the volume formed between the second support 426 and the chamber floor 106.

In some embodiments, the first and second supports 422, 426 may also thermally isolate the substrate support 400 from the chamber floor 106, i.e., 422 and 426 may also be thermal isolators. In some embodiments, the first and second supports 422, 426 may be fabricated of a process compatible material having a low thermal conductivity, or may provide a small contact area (e.g., surfaces 425, 428) between the substrate support and the chamber body to limit conductive heat loss from the substrate support 400 to the chamber body through the first and second supports 422, 426.

In some embodiments, the first and second supports 422, 426 are sized such that the support surface of the substrate support 400 is maintained in a substantially horizontal plane and is disposed above the ledge 110, thereby creating a gap between a lower surface of the substrate support 400 and the ledge 110.

While the foregoing is directed to embodiments of the present invention, other and further embodiments of the invention may be devised without departing from the basic scope thereof.

The invention claimed is:

1. A chamber for handling a substrate, comprising:
    a first chamber body having an inner volume defined in part by a floor, a ceiling, and one or more sidewalls;
    a ledge extending radially inward from the one or more sidewalls to define a central opening having a first diameter, wherein the ledge separates the inner volume into a processing volume disposed on one side of the ledge adjacent to the ceiling and a pumping volume disposed on an opposing side of the ledge adjacent to the floor;
    a pump port disposed through the floor of the first chamber body;
    a first opening disposed through the floor of the first chamber body;
    a substrate support disposed in the processing volume coaxially with respect to the central opening, the substrate support having a second diameter that is larger than the first diameter, where the substrate support is disposed in a spaced apart relation with respect to the ledge such that a gap is defined between a lower surface of the substrate support and the ledge;
    a utilities feed for providing utilities to the substrate support, wherein the utilities feed comprises a first portion disposed through the first opening and a second portion that extends laterally beneath the substrate support from the first opening to a location on a lower surface of the substrate support where the utilities feed is coupled to the substrate support;
    a notch disposed through the ledge from the central opening toward a sidewall of the one or more sidewalls, wherein at least a portion of the notch is aligned with the first opening and sized to facilitate passing the first portion of the utilities feed into the first opening; and
    a cover plate having a first edge that conforms to the geometry of the notch and a second edge with a radius equal to that of the central opening, wherein the cover plate is movably disposed between a first position that fills the notch and aligns the second edge with the central opening such that the central opening and the second edge together form a circle, and a second position that exposes the notch such that the first portion of the utilities feed can pass through the notch and into the first opening during installation.

2. The chamber of claim 1, wherein the substrate support further comprises:
    an upper plate having an upper surface and a lower surface;
    a lower plate attached to the lower surface of the upper plate; and
    a heating element disposed between the upper plate and the lower plate.

3. The chamber of claim 2, wherein an outer diameter of the lower plate is larger than an outer diameter of the upper plate.

4. The chamber of claim 2, wherein the first portion of the utilities feed further comprises an extension tube and wherein the second portion of the utilities feed further comprises a cantilever tube having a first end coupled to the lower plate near a central axis of the substrate support and having a second end coupled to the extension tube at the second end opposite the first end.

5. The chamber of claim 4, the substrate support further comprising a thermal isolator coupled to the lower plate at a central axis of the substrate support, wherein the thermal isolator extends through an opening in the cantilever tube.

6. The chamber of claim 2, wherein a peripheral edge of the lower plate overlaps the ledge while maintaining a gap between the peripheral edge and the ledge, creating a restricted flow condition between the processing volume and the pumping volume.

7. The chamber of claim 6, wherein the restricted flow condition enhances uniform gas flow from the processing volume to the pumping volume.

8. The chamber of claim 6, wherein the restricted flow condition is a choked flow condition.

9. The chamber of claim 2, the cover plate further comprising
    a first surface facing the lower plate;
    a second surface facing the second portion of the utilities feed; and
    a plurality of pins securing the cover plate between the second portion of the utilities feed and the lower plate, wherein the cover plate slides between a first position and a second position along the length of the second portion of the utilities feed and wherein the pins are configured to prevent the cover plate from sliding off of the second portion of the utilities feed.

10. The chamber of claim 4, wherein the utilities feed further comprises at least one of a heating lead, a pumping pipe, or a sensor lead disposed within the extension tube and coupled to the substrate support.

11. The chamber of claim 1, further comprising a second chamber body disposed beneath the first chamber body.

12. The chamber of claim 11, wherein the second chamber body is coupled to the first chamber body.

13. The chamber of claim 11, wherein the second chamber body and the first chamber body are integrally formed.

14. The chamber of claim 1, wherein the gap is configured to provide uniform gas flow from the processing volume to the pumping volume.

15. The chamber of claim 1, wherein the gap is about 0.26 inches.

16. A substrate support for use in a chamber for handling a substrate, the chamber comprising a first chamber body having an inner volume defined in part by a floor, a ceiling, and one or more sidewalls, a ledge extending radially inward from the one or more sidewalls to define a central opening having a first diameter, wherein the ledge separates the inner volume into a processing volume disposed on one side of the ledge adjacent to the ceiling and a pumping volume disposed on an opposing side of the ledge adjacent to the floor, a pump port and a first opening disposed through the floor of the first chamber body, and a notch disposed through the ledge from the central opening toward a sidewall of the one or more sidewalls, wherein at least a portion of the notch is aligned with the first opening and sized to facilitate passing a portion of the substrate support therethrough, the substrate support comprising:

- a body having a support surface and a second diameter that is larger than the first diameter, where the body, when installed in the chamber, is disposed in a spaced apart relation with respect to the ledge such that a gap is defined between a lower surface of the body and the ledge;
- a utilities feed to provide utilities to the body, wherein the utilities feed comprises a first portion extending away from the body such that it may be disposed through the first opening, and a second portion that extends laterally beneath the body from the first portion to a location on a lower surface of the body where the utilities feed is coupled to the body; and
- a cover plate having a first edge that conforms to the geometry of the notch and a second edge with a radius equal to that of the central opening, wherein the cover plate is movably disposed between a first position that fills the notch and aligns the second edge with the central opening such that the central opening and the second edge together form a circle, and a second position that exposes the notch such that the first portion of the utilities feed can pass through the notch and into the first opening during installation.

17. A substrate support for use in a chamber for handling a substrate, comprising:

- a body having a support surface to support a substrate;
- a utilities feed coupled to the body to provide utilities to the body, wherein the utilities feed comprises a second portion coupled to the body and extending laterally away from the body beyond a diameter of the body, and a first portion coupled to the second portion and extending perpendicularly away from the body; and
- a cover plate movably disposable beneath and with respect to the body between a first position and a second position, wherein in the first position the cover plate is disposed predominantly beneath the body and not over the first portion of the utilities feed, wherein in the second position the cover plate is disposed over the first portion of the utilities feed and includes a portion disposed beneath the body, and wherein the portion disposed beneath the body has a curved edge aligned with a radial arc of the body and having a radius equal to the distance from a central axis of the support surface to the curved edge.

18. The substrate support of claim 17, wherein the cover plate comprises a second primary surface having a plurality of features extending therefrom to interface with the second portion of the utilities feed.

19. The substrate support of claim 17, wherein the second portion of the utilities feed is coupled to the body at a location coincident with a central axis of the support surface.

20. The substrate support of claim 17, wherein one or more supports are disposed on a lower surface of the substrate support proximate a central axis of the substrate support.

* * * * *